US012543414B2

(12) United States Patent
Chang et al.

(10) Patent No.: US 12,543,414 B2
(45) Date of Patent: Feb. 3, 2026

(54) LIGHT EMITTING DIODE MODULE AND MANUFACTURING METHOD THEREOF

(71) Applicant: Jentech Precision Industrial Co., LTD., Taoyuan (TW)

(72) Inventors: Jian-Tsai Chang, Taoyuan (TW); Chin-Jui Yu, Taoyuan (TW); Jheng-Dong Huang, Taoyuan (TW)

(73) Assignee: Jentech Precision Industrial Co., LTD., Taoyuan (TW)

( * ) Notice: Subject to any disclaimer, the term of this patent is extended or adjusted under 35 U.S.C. 154(b) by 370 days.

(21) Appl. No.: 18/346,871

(22) Filed: Jul. 5, 2023

(65) Prior Publication Data

US 2023/0343901 A1    Oct. 26, 2023

Related U.S. Application Data

(63) Continuation-in-part of application No. 17/200,926, filed on Mar. 15, 2021, now Pat. No. 11,705,547.

(30) Foreign Application Priority Data

May 21, 2020 (TW) ................. 109116963

(51) Int. Cl.
*H10H 20/831* (2025.01)
*H10H 20/01* (2025.01)
(Continued)

(52) U.S. Cl.
CPC .... *H10H 20/8316* (2025.01); *H10H 20/8162* (2025.01); *H10H 20/832* (2025.01); *H10H 20/857* (2025.01)

(58) Field of Classification Search
CPC .......... H10H 20/8506; H10H 20/8316; H10H 20/857; H10H 20/0364
See application file for complete search history.

(56) References Cited

U.S. PATENT DOCUMENTS

2016/0181493 A1* 6/2016 Miki ................... H10H 20/856
257/99
2017/0133568 A1   5/2017 Miki
(Continued)

FOREIGN PATENT DOCUMENTS

CN    105210201 A    12/2015
JP    2008-192635 A    8/2008
(Continued)

*Primary Examiner* — Antonio B Crite
(74) *Attorney, Agent, or Firm* — CKC & Partners Co., LLC

(57) ABSTRACT

A light emitting diode module includes a first conductive device, a second conductive device, an insulating structure and a plating layer. The first conductive device includes a first metal layer and a first protecting layer covering the first metal layer. The second conductive device includes a second metal layer and a second protecting layer covering the second metal layer. The insulating structure covers around and forms gaps with the first and the second conductive devices. The plating layer is disposed on the first and the second protecting layers to fill up the gaps. The plating layer is of a same material as the first protecting layer and the second protecting layer. The insulating structure covers portions of upper surfaces of the first and the second conductive devices. The plating layer covers remaining portions of the upper surfaces of the first and the second conductive devices.

16 Claims, 12 Drawing Sheets

(51) Int. Cl.
_H10H 20/816_ (2025.01)
_H10H 20/832_ (2025.01)
_H10H 20/85_ (2025.01)
_H10H 20/857_ (2025.01)

(56) References Cited

U.S. PATENT DOCUMENTS

2017/0299867 A1 10/2017 Tsai et al.
2020/0227343 A1 7/2020 Huang

FOREIGN PATENT DOCUMENTS

| | | |
|---|---|---|
| JP | 2012-089638 A | 5/2012 |
| JP | 2012-182207 A | 9/2012 |
| JP | 2013-041950 A | 2/2013 |
| JP | 2013-179271 A | 9/2013 |
| JP | 2013-232595 A | 11/2013 |
| JP | 2013-236005 A | 11/2013 |
| JP | 2014-179458 A | 9/2014 |
| JP | 2015-188081 A | 10/2015 |
| JP | 2016-001702 A | 1/2016 |
| JP | 2016-119464 A | 6/2016 |
| JP | 2016181733 A | 10/2016 |
| JP | 2017-117901 A | 6/2017 |
| JP | 2017-157644 A | 9/2017 |
| JP | 2020088302 A | 6/2020 |

* cited by examiner

LIGHT EMITTING DIODE MODULE AND MANUFACTURING METHOD THEREOF

RELATED APPLICATIONS

This application is a Continuation-in-part of U.S. application Ser. No. 17/200,926, filed on Mar. 15, 2021, which claims priority to Taiwanese Application Serial Number 109116963, filed on May 21, 2020, the entirety of which is incorporated by reference herein in their entireties.

BACKGROUND

Technical Field

The present disclosure relates to optical equipment and its manufacturing method. More particularly, the present disclosure relates to light emitting diode modules and their manufacturing method.

Description of Related Art

Light-emitting diodes have been widely used in different fields because of their advantages of small size, high efficiency, long life, low energy consumption, etc.

For the existing light-emitting diodes, there is a way of packaging using Quad Flat No-leads (QFN). By extending downwards and disposing the electrical connection points on the bottom surface of the package component, the advantages of high-density and small-volume for packaging are achieved. However, how to provide a light-emitting package component with a higher reliability is one of the objectives that those skilled in the art continue to develop.

SUMMARY

A technical aspect of the present disclosure is to provide a light emitting device, which can have a higher reliability.

According to an embodiment of the present disclosure, a light emitting diode module includes a first conductive device, a second conductive device, an insulating structure and a first plating layer. The first conductive device includes a first metal layer and a first protecting layer. The first protecting layer covers the first metal layer. The second conductive device includes a second metal layer and a second protecting layer. The second protecting layer covers the second metal layer. The insulating structure covers around the first conductive device and around the second conductive device. The insulating structure forms at least one first gap with the first conductive device therebetween and at least one second gap with the second conductive device therebetween. The insulating structure includes a first opening and a second opening. The first plating layer is disposed on the first protecting layer and the second protecting layer in the first opening and the second opening to cover on the first protecting layer and the second protecting layer and to fill up the first gap and the second gap. The first plating layer is of a same material as the first protecting layer and the second protecting layer. The first conductive device has a first upper surface and a first lower surface. The second conductive device has a second upper surface and a second lower surface. The insulating structure covers a portion of the first upper surface and a portion of the second upper surface. The first plating layer covers a remaining portion of the first upper surface and a remaining portion of the second upper surface. The first lower surface and the second lower surface are located in the second opening.

In one or more embodiments of the present disclosure, a material of the first metal layer and a material of the second metal layer are copper.

In one or more embodiments of the present disclosure, a material of the first protecting layer, a material of the second protecting layer and a material of the first plating layer are nickel.

In one or more embodiments of the present disclosure, the light emitting diode module further includes a second plating layer. The second plating layer is disposed on the first plating layer. A material of the second plating layer is palladium.

In one or more embodiments of the present disclosure, the light emitting diode module includes a third plating layer. The third plating layer is disposed on the second plating layer. A material of the third plating layer is gold.

In one or more embodiments of the present disclosure, an overall thickness of the first plating layer, the second plating layer and the third plating layer is larger than 1.5 microns.

In one or more embodiments of the present disclosure, the light emitting diode module further includes a second plating layer. The second plating layer is disposed on the first plating layer. A material of the second plating layer is silver.

In one or more embodiments of the present disclosure, the insulating structure completely covers a first lateral surface of the first conductive device and a second lateral surface of the second conductive device. The first lateral surface is connected between the first upper surface and the first lower surface. The second lateral surface is connected between the second upper surface and the second lower surface.

Another technical aspect of the present disclosure is to provide a method of manufacturing a light emitting diode module, which can manufacture a light emitting diode module with a higher reliability.

According to an embodiment of the present disclosure, a method of manufacturing a light emitting diode module includes covering a first protecting layer on a first metal layer to form a first conductive device, and covering a second protecting layer on a second metal layer to form a second conductive device; covering around the first conductive device and around the second conductive device by an insulating structure, in which the insulating structure includes a first opening and a second opening; and disposing a first plating layer on the first protecting layer and the second protecting layer in the first opening and the second opening, such that at least a portion of the first plating layer fills up a first gap formed between the first protecting layer and the insulating structure and a second gap formed between the second protecting layer and the insulating structure. The first plating layer is of a same material as the first protecting layer and the second protecting layer.

In one or more embodiments of the present disclosure, a material of the first protecting layer, a material of the second protecting layer and a material of the first plating layer are nickel.

In one or more embodiments of the present disclosure, the method further includes disposing a second plating layer on the first plating layer.

In one or more embodiments of the present disclosure, a material of the second plating layer is silver.

In one or more embodiments of the present disclosure, the method further includes disposing a third plating layer on the second plating layer, such that an overall thickness of the first plating layer, the second plating layer and the third plating layer is larger than 1.5 microns.

In one or more embodiments of the present disclosure, a material of the second plating layer is palladium, and a material of the third plating layer is gold.

In one or more embodiments of the present disclosure, the method further includes treating superficially the insulating structure and the first protecting layer and the second protecting layer in the first opening and the second opening before disposing the first plating layer.

In one or more embodiments of the present disclosure, the step of covering around the first conductive device and around the second conductive device by the insulating structure includes covering completely a first lateral surface connected between a first upper surface and a first lower surface of the first conductive device and a second lateral surface connected between a second upper surface and a second lower surface of the second conductive device. The first lower surface is opposite to the first upper surface. The second lower surface is opposite to the second upper surface.

In one or more embodiments of the present disclosure, a material of the first metal layer and a material of the second metal layer are copper.

When compared with the prior art, the above-mentioned embodiments of the present disclosure have at least the following advantage: the light emitting diode module can provide a good interface of electrical connection though the protection of the first metal layer by the first protecting layer, the protection of the second metal layer by the second protecting layer, and the disposal of the first plating layer on the first conductive device and the second conductive device exposed from the insulating structure. The method of manufacturing the light emitting diode module in this embodiment can manufacture the light emitting diode module with a higher reliability through forming the first protecting layer and the second protecting layer before covering the insulating structure, and forming the first plating layer after covering the insulating structure.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
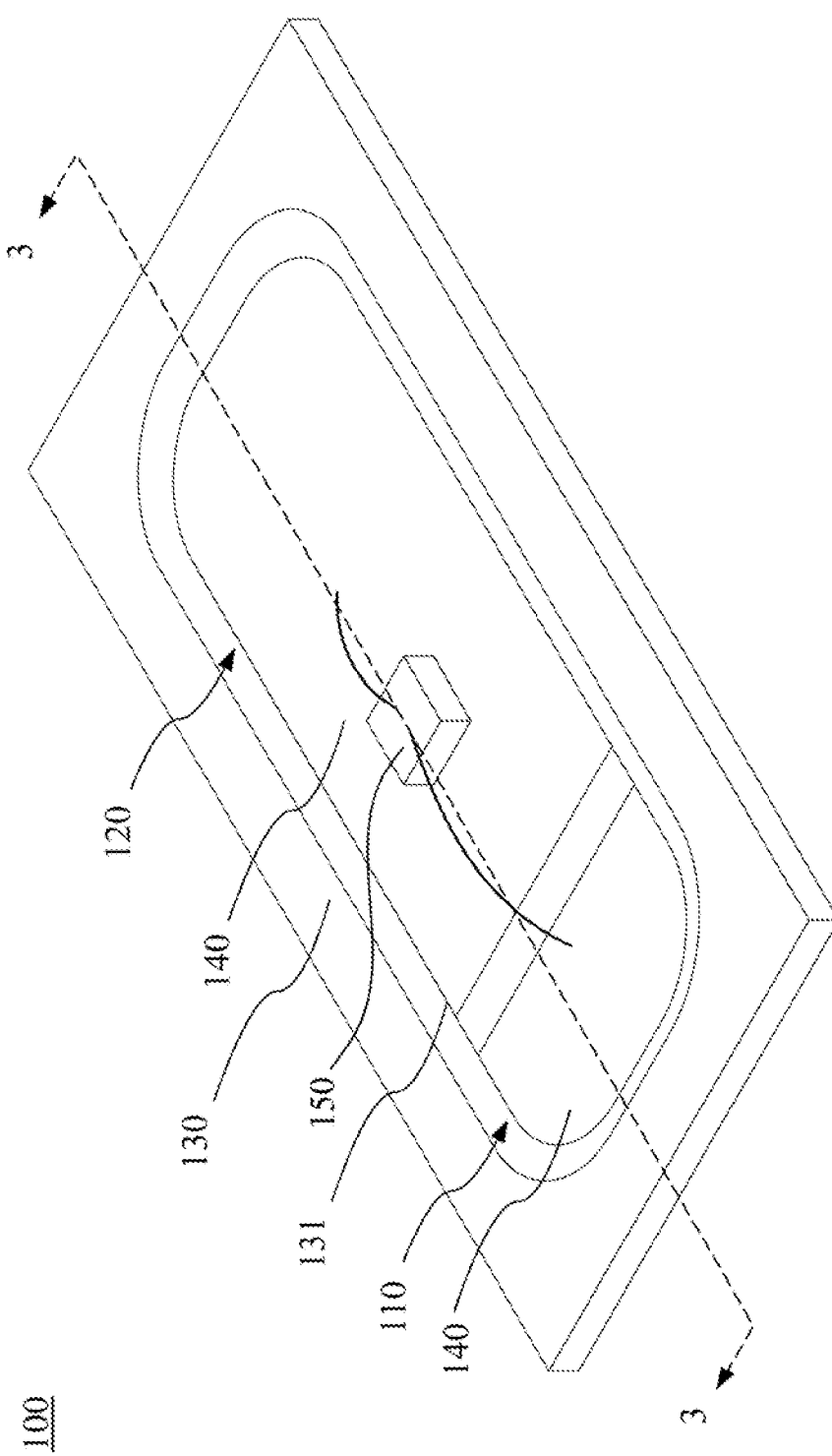
FIG. 1 and FIG. 2 are schematic views of a light emitting diode module according to an embodiment of the present disclosure.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
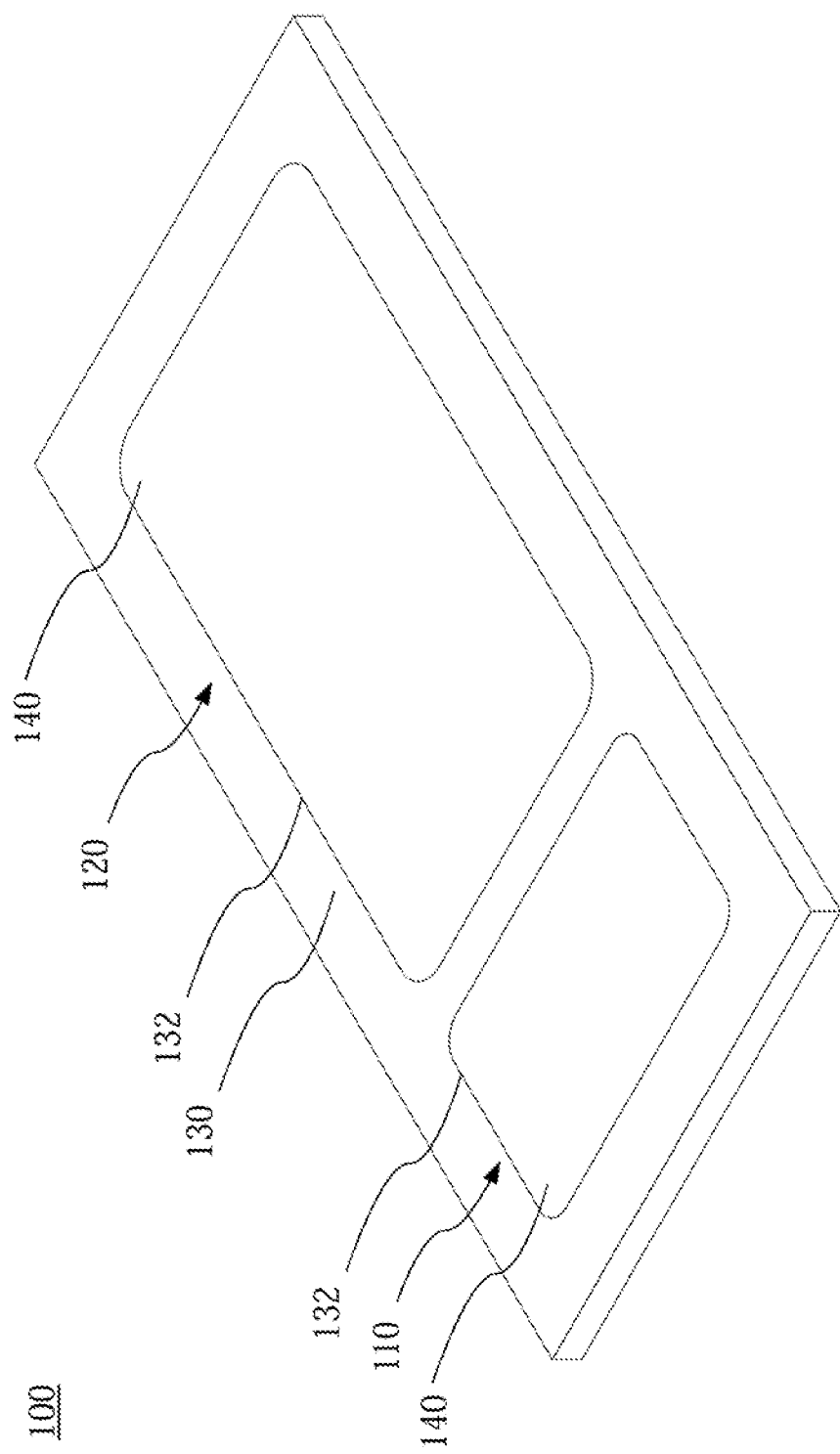

FIG. 1 and FIG. 2 are schematic views of a light emitting diode module 100 according to an embodiment of the present disclosure, in which FIG. 1 shows a first opening 131 of an insulating structure 130 while FIG. 2 shows a second opening 132 of the insulating structure 130. As shown in FIG. 1, a light emitting diode module 100 includes a first conductive device 110, a second conductive device 120, an insulating structure 130 and a first plating layer 140.

To be specific, the insulating structure 130 includes a first opening 131, and the first plating layer 140 is disposed on the first conductive device 110 and the second conductive device 120 in the first opening 131. To be more specific, as shown in FIG. 1 and FIG. 2, the first conductive device 110 and the second conductive device 120 are covered by the first plating layer 140. The details are illustrated below with sectional views.

Reference is made to FIG. 2. The insulating structure 130 includes a second opening 132, and the first plating layer 140 is disposed on the first conductive device 110 and the second conductive device 120 in the second opening 132.

Figure 3:
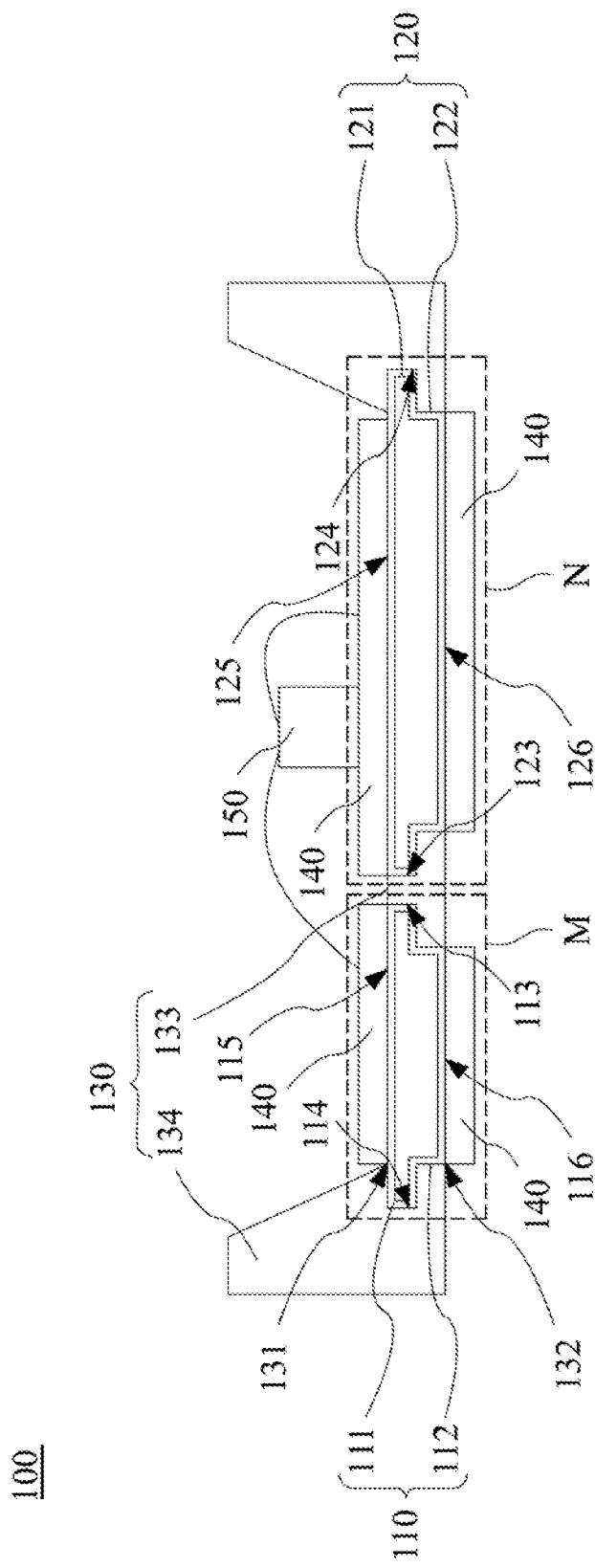
FIG. 3 is a cross-sectional view along a cutting line 3 of FIG. 1.

FIG. 3 is a cross-sectional view along a cutting line 3 of FIG. 1. Reference is made to FIG. 3. The first conductive device 110 includes a first metal layer 111 and a first protecting layer 112. The first protecting layer 112 entirely covers the first metal layer 111, such that the first metal layer 111 is completely located inside a confined space enclosed by the first protecting layer 112 without any exposure out of the first protecting layer 112. The second conductive device 120 includes a second metal layer 121 and a second protecting layer 122. The second protecting layer 122 entirely covers the second metal layer 121, such that the second metal layer 121 is completely located inside a confined space enclosed by the second protecting layer 122 without any exposure out of the second protecting layer 122.

The insulating structure 130 covers around the first conductive device 110 and around the second conductive device 120. To be precise, the insulating structure 130 covers around the first protecting layer 112 of the first conductive device 110, and the first protecting layer 112 completely isolates the insulating structure 130 and the first metal layer 111 from each other. Similarly, the insulating structure 130 covers around the second protecting layer 122 of the second conductive device 120, and the second protecting layer 122 completely isolates the insulating structure 130 and the second metal layer 121 from each other. The first plating layer 140 is disposed on the first protecting layer 112 and the second protecting layer 122 in the first opening 131 and the second opening 132. In other words, in this embodiment, the insulating structure 130 directly contacts at least a portion of the first protecting layer 112 and at least a portion of the second protecting layer 122.

To be specific, the insulating structure 130 can have an isolating bar 133, and the isolating bar 133 is disposed between the first conductive device 110 and the second conductive device 120. In other words, a lateral surface 113 of the first protecting layer 112 of the first conductive device 110 facing to the second conductive device 120 is entirely covered by the isolating bar 133, and a lateral surface 123 of the second protecting layer 122 of the second conductive device 120 facing to the first conductive device 110 is also entirely covered by the isolating bar 133.

Figure 4:
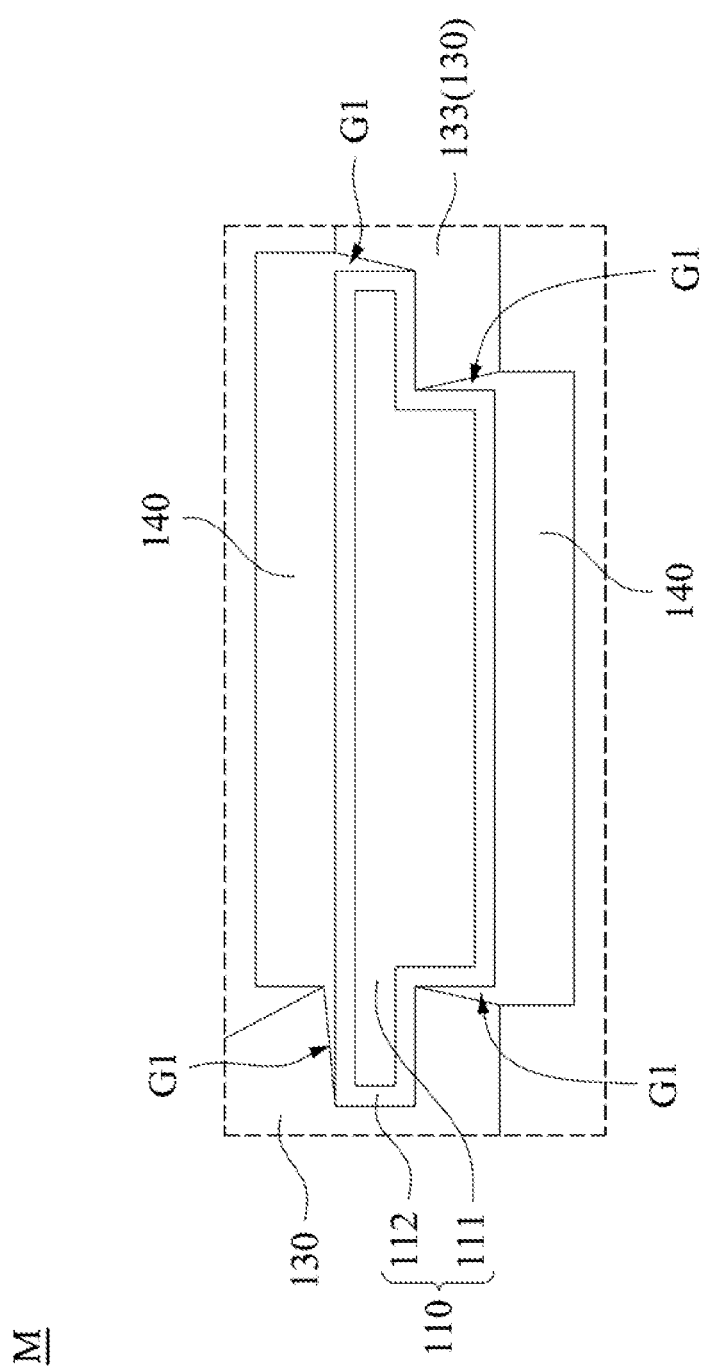
FIG. 4 is an enlarged view of the region M of FIG. 3.

Reference is made to FIG. 4. FIG. 4 is an enlarged view of the region M of FIG. 3. In practical applications, as shown in FIG. 4, at least one first gap G1 is formed between the first protecting layer 112 of the first conductive device 110 and the insulating structure 130 (or the isolating bar 133). Meanwhile, apart from covering on the first protecting layer 112, at least a portion of the first plating layer 140 fills up the first gap G1, such that the overall structural strength of the light emitting diode module 100 is enhanced.

Figure 5:
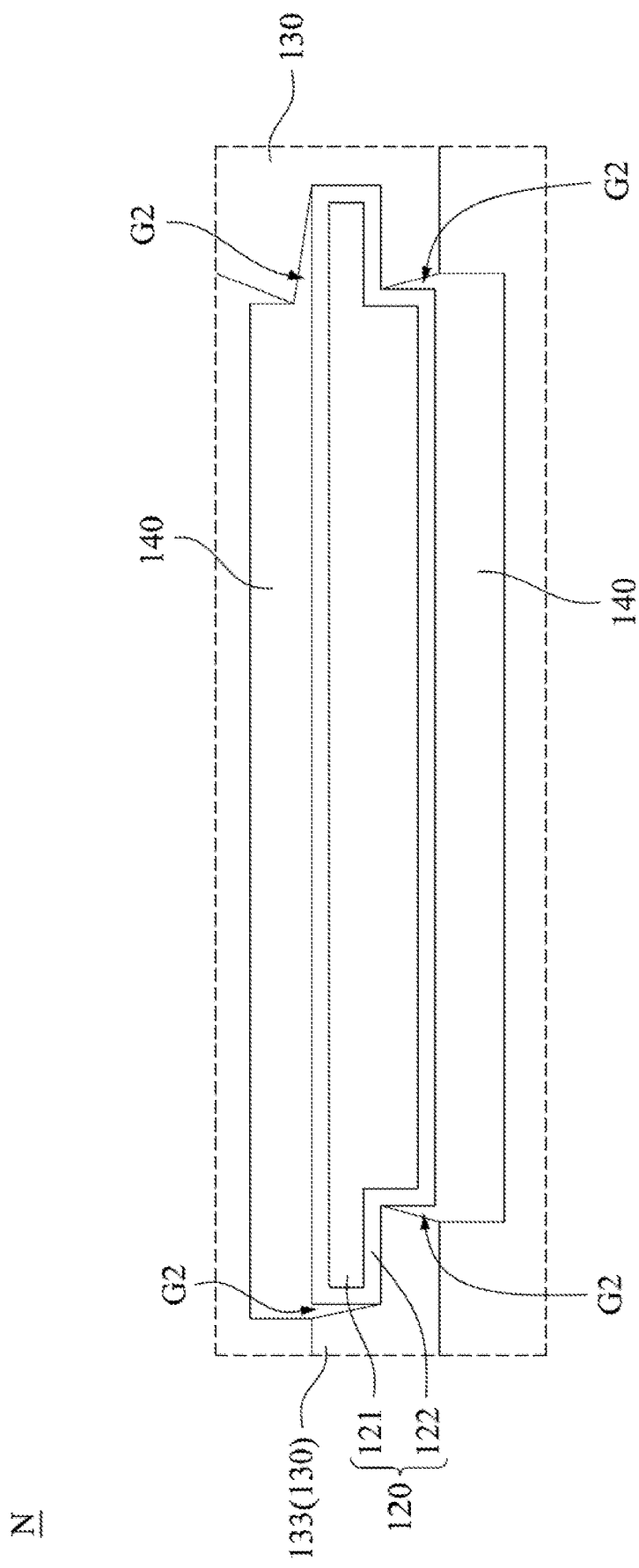
FIG. 5 is an enlarged view of the region N of FIG. 3.

Reference is made to FIG. 5. FIG. 5 is an enlarged view of the region N of FIG. 3. In practical applications, as shown in FIG. 5, at least one second gap G2 is formed between the second protecting layer 122 of the second conductive device 120 and the insulating structure 130 (or the isolating bar 133). Meanwhile, apart from covering on the second protecting layer 122, at least a portion of the first plating layer 140 fills up the second gap G2, such that the overall structural strength of the light emitting diode module 100 is enhanced.

Furthermore, as shown in FIG. 3, the insulating structure 130 can have an annular structure 134, and the isolating bar 133 is located within and connected with the annular structure 134. A remaining lateral surface 114 of the first protecting layer 112 of the first conductive device 110 and a remaining lateral surface 124 of the second protecting layer 122 of the second conductive device 120 are entirely covered by the annular structure 134 of the insulating structure 130.

In addition, the first protecting layer 112 of the first conductive device 110 has a first upper surface 115 and a first lower surface 116 opposite to the first upper surface 115. The second protecting layer 122 of the second conductive device 120 has a second upper surface 125 and a second lower surface 126 opposite to the second upper surface 125.

To be specific, the lateral surface 113 and the lateral surface 114 of the first protecting layer 112 are respectively connected between the first upper surface 115 and the first lower surface 116, while the insulating structure 130 completely covers the lateral surface 113 and the lateral surface 114 of the first protecting layer 112. Similarly, the lateral surface 123 and the lateral surface 124 of the second protecting layer 122 are respectively connected between the second upper surface 125 and the second lower surface 126, while the insulating structure 130 completely covers the lateral surface 123 and the lateral surface 124 of the second protecting layer 122.

The insulating structure 130 covers a portion of the first upper surface 115 and a portion of the second upper surface 125, and the region covered by the insulating structure 130 is not disposed with the first plating layer 140 thereon. The first plating layer 140 covers a remaining portion of the first upper surface 115 and a remaining portion of the second upper surface 125. The first lower surface 116 and the second lower surface 126 are located in the second opening 132.

On the other hand, the first upper surface 115 and the second upper surface 125 are coplanar. Thus, the first plating layer 140 is disposed on the first upper surface 115 and the second upper surface 125, forming a surface suitable for a light emitting diode chip 150 to be disposed on and electrically connected with.

To be specific, a material of the first metal layer 111 and a material of the second metal layer 121 are copper. Furthermore, a material of the first protecting layer 112, a material of the second protecting layer 122 and a material of the first plating layer 140 are the same. In practice, a material of the first protecting layer 112, a material of the second protecting layer 122 and a material of the first plating layer 140 are nickel. However, this does not intend to limit the present disclosure. In other embodiments of the present disclosure, the material of the first metal layer 111 and the material of the second metal layer 121 can be of other conductive materials.

Therefore, in this embodiment, the first protecting layer 112 covering the first metal layer 111 can avoid the first metal layer 111 from forming a displacement reaction, such that the reliability of the product is increased and the reliability of the quality of the electrical connection of the light emitting diode chip 150 is enhanced. For example, the material of the first metal layer 111 and the material of the second metal layer 121 in this embodiment are copper. The first protecting layer 112 and the second protecting layer 122 can respectively protect the first metal layer 111 and the second metal layer 121 and avoid from copper replacement, which can increase the functional reliability of the functions of the product.

Figure 6:
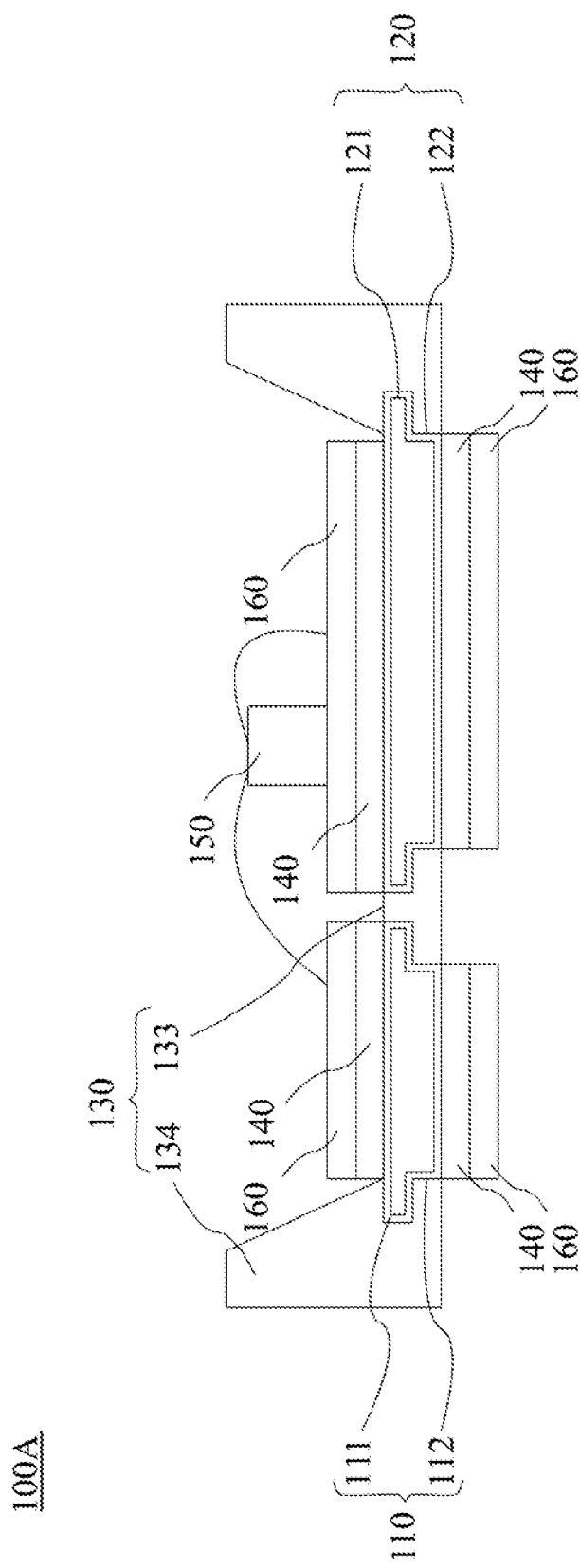
FIG. 6 is a schematic view of a light emitting diode module according to another embodiment of the present disclosure.

FIG. 6 is a schematic view of a light emitting diode module 100A according to another embodiment of the present disclosure. Reference is made to FIG. 6. In another embodiment of the present disclosure, the light emitting diode module 100A is similar to the light emitting diode module 100 in the embodiment mentioned above. The light emitting diode module 100A includes a first conductive device 110, a second conductive device 120, an insulating structure 130 and a first plating layer 140.

In this embodiment, the light emitting diode module 100A includes a second plating layer 160. The second plating layer 160 is disposed on the first plating layer 140. To be specific, the second plating layer 160 in this embodiment is only disposed on the first plating layer 140.

For example, a material of the second plating layer 160 is silver. Thus, the second plating layer 160 can further enhance the quality of electrical connection.

Figure 7:
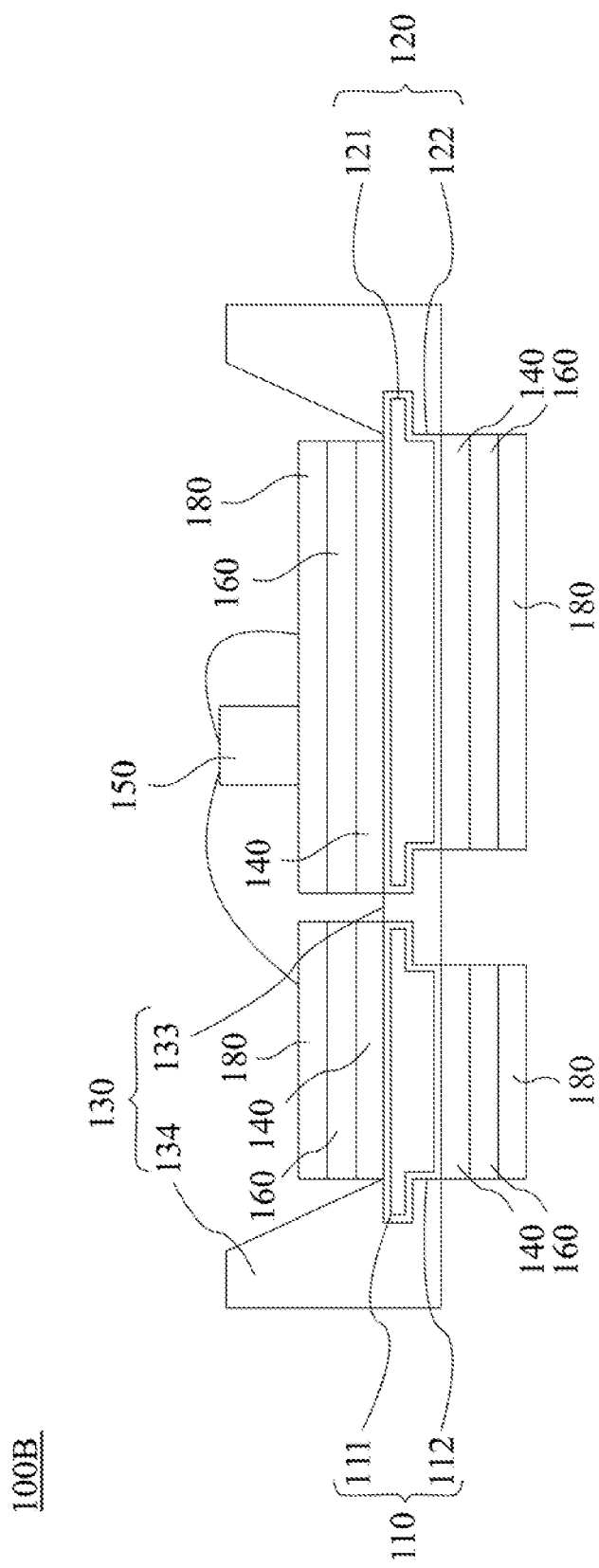
FIG. 7 is a schematic view of a light emitting diode module according to another embodiment of the present disclosure.

FIG. 7 is a schematic view of a light emitting diode module 100B according to another embodiment of the present disclosure. Reference is made to FIG. 7. In another embodiment of the present disclosure, the light emitting diode module 100B is similar to the light emitting diode modules 100, 100A in the embodiments mentioned above. The light emitting diode module 100B includes a first conductive device 110, a second conductive device 120, an insulating structure 130 and a first plating layer 140.

In this embodiment, the light emitting diode module 100B includes a third plating layer 180. The third plating layer 180 is disposed on the second plating layer 160. To be specific, the third plating layer 180 in this embodiment is only disposed on the second plating layer 160.

For example, a material of the second plating layer 160 is palladium and a material of the third plating layer 180 is gold. Thus, the first plating layer 140, the second plating layer 160 and the third plating layer 180 can form together a conductive structure suitable for electrically connecting with the light emitting diode chip 150. However, this does not intend to limit the present disclosure. In other embodiments of the present disclosure, the material of the second plating layer 160 and the material of the third plating layer 180 can be of other conductive materials.

Furthermore, in practice, an overall thickness of the first plating layer 140, the second plating layer 160 and the third plating layer 180 is larger than 1.5 microns, such that the overall structural strength of the light emitting diode module 100B is enhanced.

Figure 8:
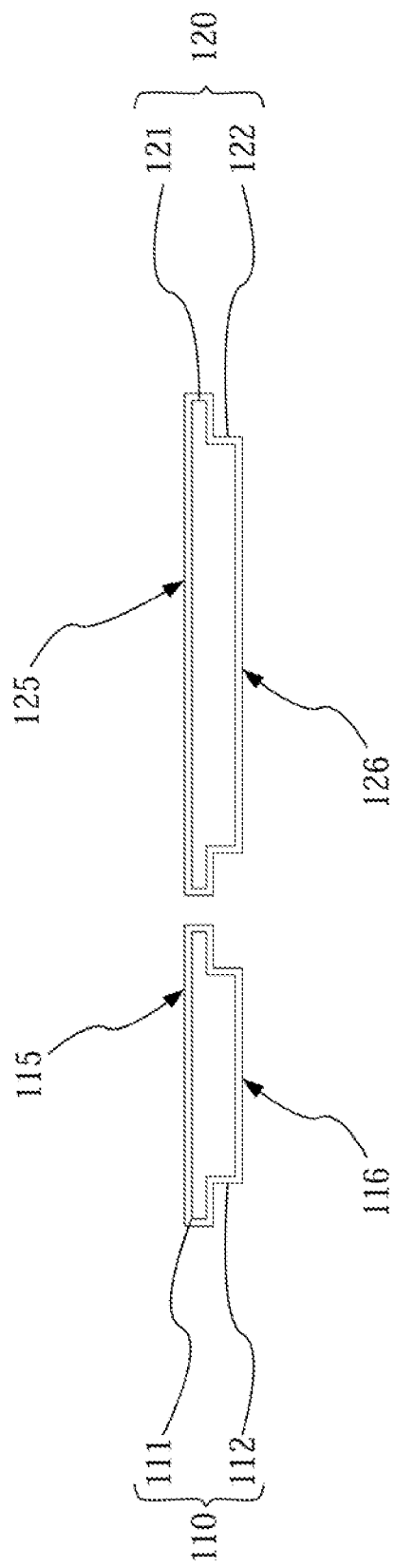
FIG. 8 to FIG. 12 are sectional views of a manufacturing process of a light emitting diode module according to other embodiments of the present disclosure.

FIG. 8 to FIG. 12 are sectional views of a manufacturing process of a light emitting diode module according to an embodiment of the present disclosure. Reference is made to FIG. 8. According to a manufacturing method of the light emitting diode module in this embodiment, the first protecting layer 112 is covered on the first metal layer 111 to form the first conductive device 110, and the second protecting layer 122 is covered on the second metal layer 121 to form the second conductive device 120.

To be specific, the first upper surface 115 of the first conductive device 110 and the second upper surface 125 of the second conductive device 120 are coplanar. The first lower surface 116 of the first conductive device 110 and the second lower surface 126 of the second conductive device 120 are coplanar.

Figure 9:
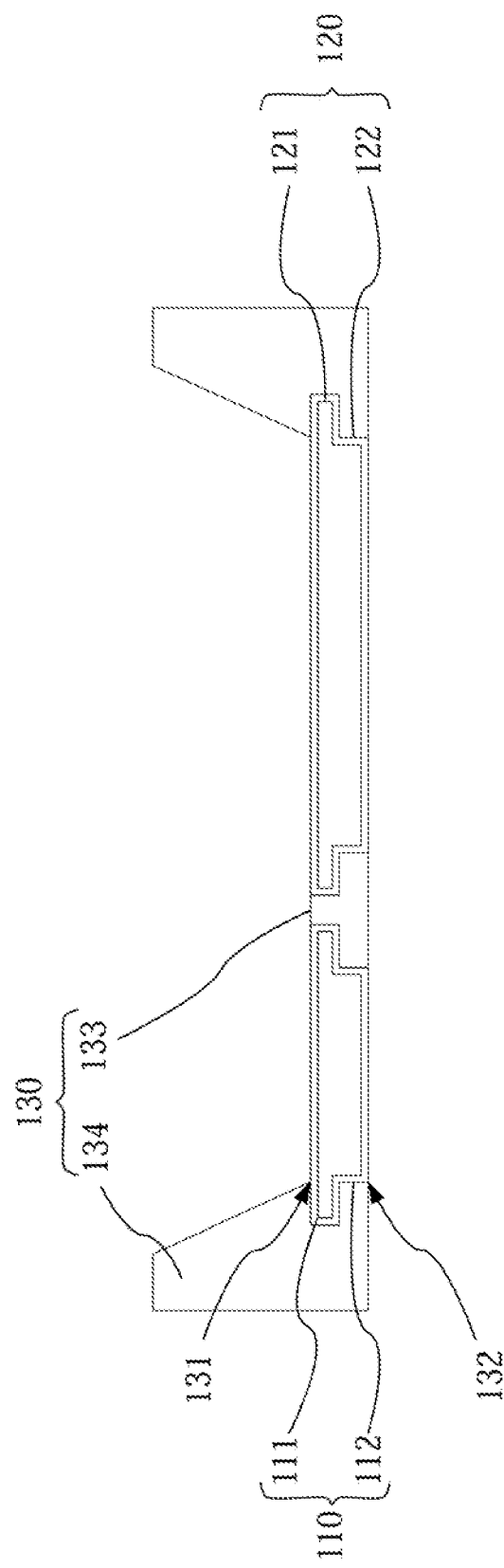

Reference is made to FIG. 9. According to the manufacturing method of this embodiment, the insulating structure 130 covers around the first protecting layer 112 of the first conductive device 110 and around the second protecting layer 122 of the second conductive device 120, and the insulating structure 130 includes the first opening 131 and the second opening 132.

Figure 10:
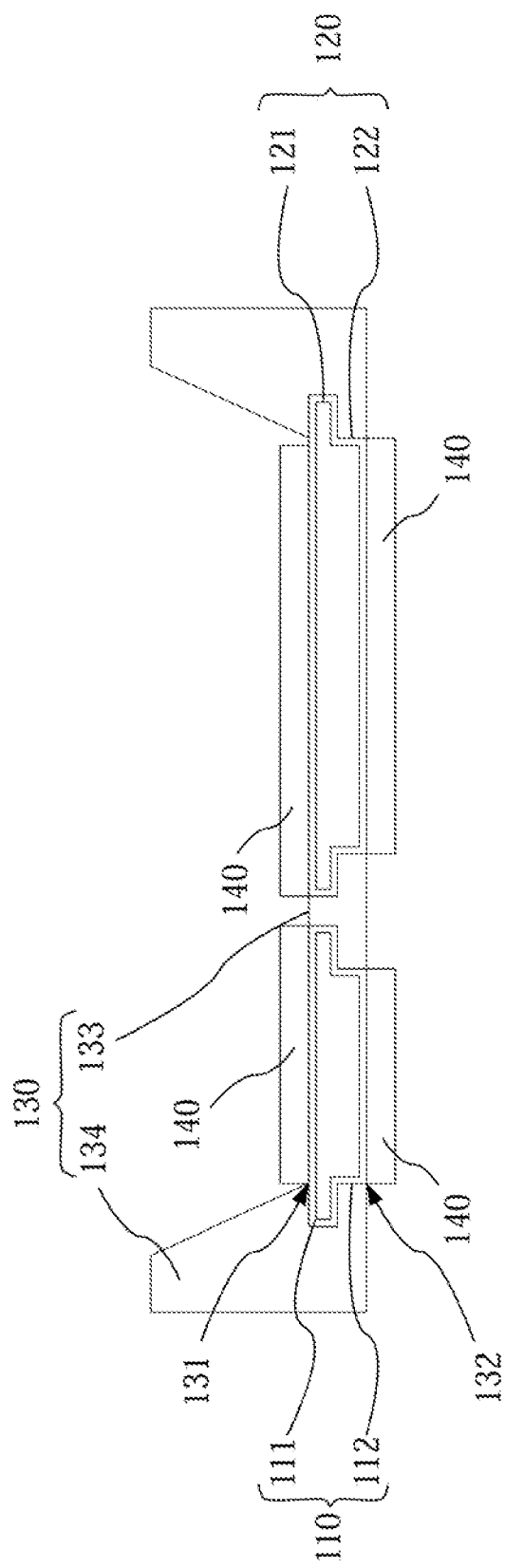

Reference is made to FIG. 10. According to the manufacturing method of this embodiment, the first plating layer 140 is disposed on the first protecting layer 112 and the second protecting layer 122 in the first opening 131 and the second opening 132, such that the first plating layer 140 covers on the first protecting layer 112 and the second protecting layer 122 and fills up the first gap G1 and the second gap G2 (please refer to FIGS. 4-5 for the first gap G1 and the second gap G2).

Therefore, the first plating layer 140 in this embodiment is only disposed on the first protecting layer 112 and the second protecting layer 122 exposed from the insulating structure 130. In other words, the insulating structure 130 and the first plating layer 140 cover around the first conductive device 110. The distribution regions of the insulating structure 130 and the first plating layer 140 on the first conductive device 110 do not overlap with each other. The insulating structure 130 and the first plating layer 140 cover around the second conductive device 120. The distribution regions of the insulating structure 130 and the first plating layer 140 on the second conductive device 120 do not overlap with each other. In other words, the insulating structure 130 and the first plating layer 140 are free from overlapping with each other. Through the steps as mentioned above, the manufacturing method in this embodiment can further dispose the light emitting diode chip 150 (please refer to FIG. 3) on the second conductive device 120 to form the light emitting diode module 100 (please refer to FIG. 3) as mentioned above.

On the other hand, the insulating structure 130 in this embodiment is formed from the way of stamping, such that a portion of the first protecting layer 112 and a portion of the second protecting layer 122 are exposed. In other embodiments, the manufacturing method further includes treating superficially (carrying out a surface treatment on) the insulating structure 130 and the first protecting layer 112 and the second protecting layer 122 exposed from the insulating structure 130 before disposing the first plating layer 140. In details, through the surface treatment to the insulating structure 130, and the surface treatment to the first protecting layer 112 and the second protecting layer 122 in the first opening 131 and the second opening 132 of the insulating structure 130, the burrs produced at the insulating structure 130 after the process of stamping and the metal oxide layer on the first protecting layer 112 and the second protecting layer 122 are removed.

Figure 11:
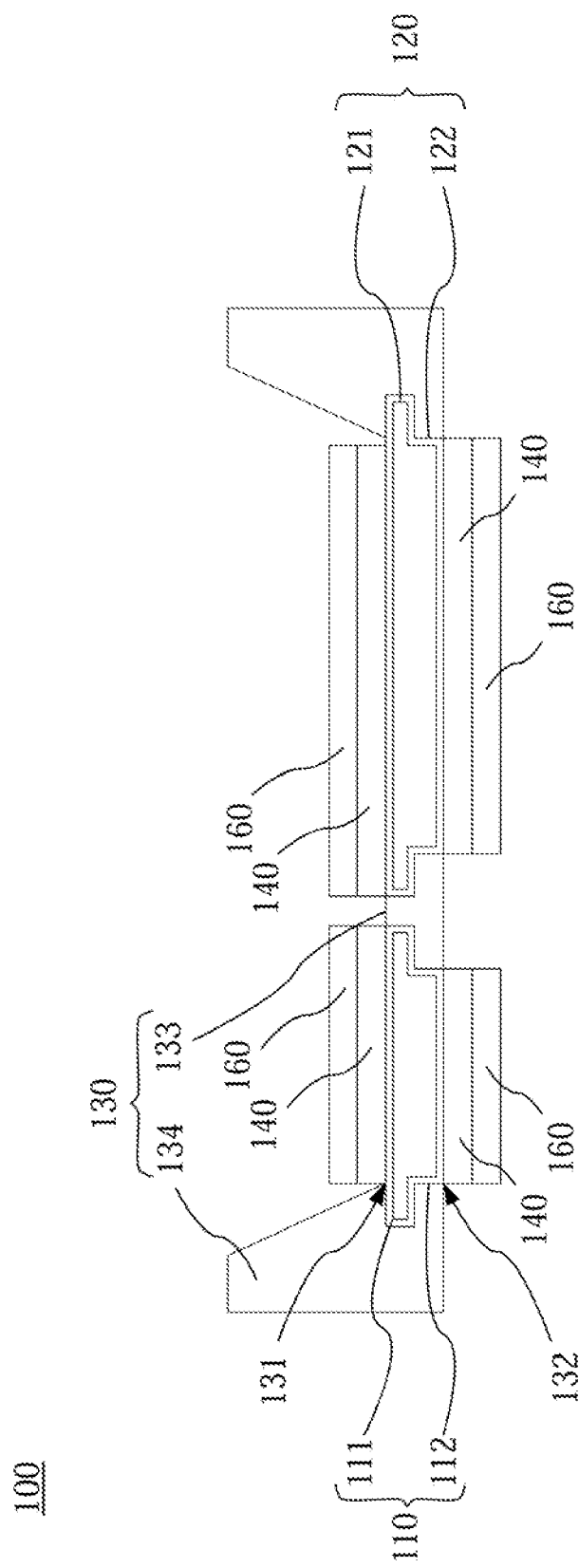

Reference is made to FIG. 11. In another embodiment of the present disclosure, according to the manufacturing method of the light emitting diode module 100, the second plating layer 160 is further disposed on the first plating layer 140. Through the steps as mentioned above, the manufacturing method in this embodiment can further dispose a light emitting diode chip 150 on the second conductive device 120 to form the light emitting diode module 100A (please refer to FIG. 6) as mentioned above.

Figure 12:
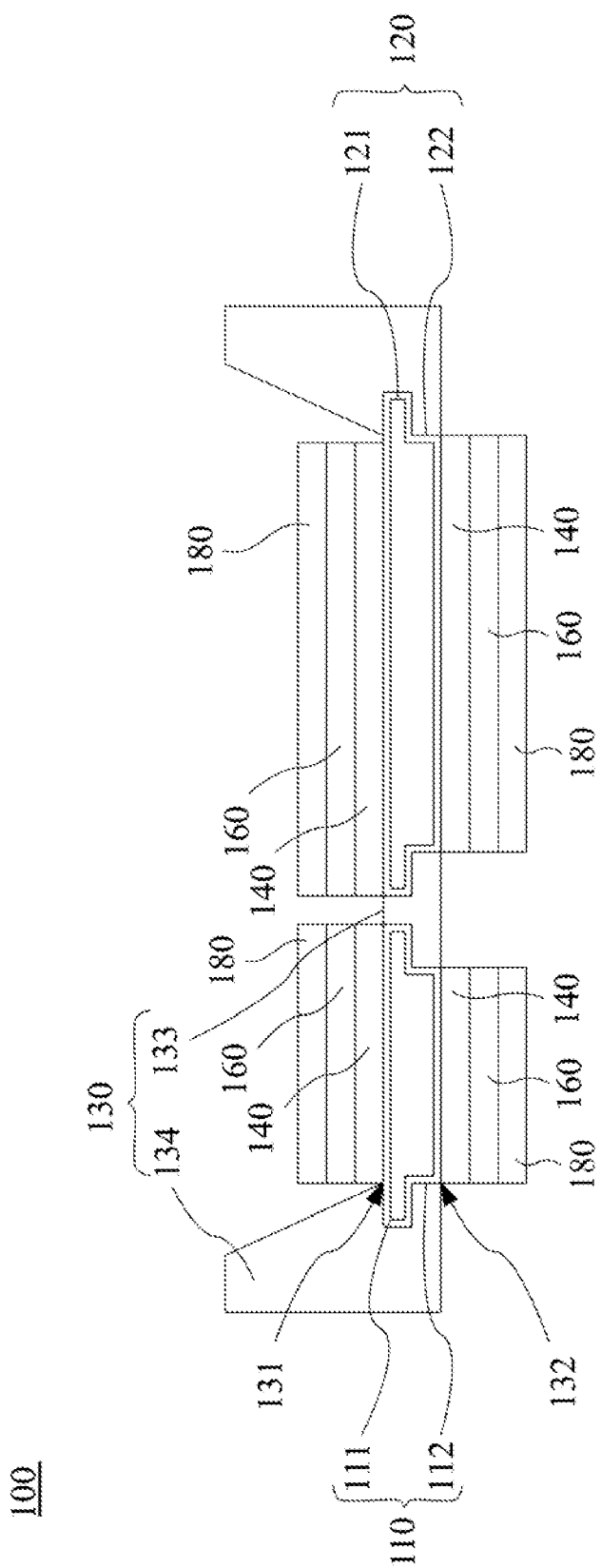

Reference is made to FIG. 12. In another embodiment of the present disclosure, according to the manufacturing method of the light emitting diode module 100, the third plating layer 180 is further disposed on the second plating layer 160. Through the steps as mentioned above, the manufacturing method in this embodiment can further dispose a light emitting diode chip 150 on the second conductive device 120 to form the light emitting diode module 100B (please refer to FIG. 7) as mentioned above.

In conclusion, when compared with the prior art, the aforementioned embodiments of the present disclosure have at least the following advantage: the light emitting diode module can provide a good interface of electrical connection though the protection of the first metal layer by the first protecting layer, the protection of the second metal layer by the second protecting layer, and the disposal of the first plating layer on the first conductive device and the second conductive device exposed from the insulating structure. The method of manufacturing the light emitting diode module in this embodiment can manufacture the light emitting diode module with a higher reliability through forming the first protecting layer and the second protecting layer before covering the insulating structure, and forming the first plating layer after covering the insulating structure.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A light emitting diode module, comprising:
   a first conductive device, comprising:
     a first metal layer; and
     a first protecting layer covering the first metal layer;
   a second conductive device, comprising:
     a second metal layer; and
     a second protecting layer covering the second metal layer;
   an insulating structure covering around the first conductive device and around the second conductive device and forming at least one first gap with the first conductive device therebetween and at least one second gap with the second conductive device therebetween, the insulating structure comprising a first opening and a second opening; and a first plating layer disposed on the first protecting layer and the second protecting layer in the first opening and the second opening to cover on the first protecting layer and the second protecting layer and to fill up the first gap and the second gap, the first plating layer being of a same material as the first protecting layer and the second protecting layer, wherein the first conductive device has a first upper surface and a first lower surface, the second conductive device has a second upper surface and a second lower surface, the insulating structure covers a portion of the first upper surface and a portion of the second upper surface, the first plating layer covers a remaining portion of the first upper surface and a remaining portion of the second upper surface, the first lower surface and the second lower surface are located in the second opening, a material of the first protecting layer, a material of the second protecting layer and a material of the first plating layer are nickel.

2. The light emitting diode module of claim 1, wherein a material of the first metal layer and a material of the second metal layer are copper.

3. The light emitting diode module of claim 1, further comprising a second plating layer disposed on the first plating layer, and a material of the second plating layer is silver.

4. The light emitting diode module of claim 1, wherein the insulating structure completely covers a first lateral surface of the first conductive device and a second lateral surface of the second conductive device, the first lateral surface is connected between the first upper surface and the first lower surface, the second lateral surface is connected between the second upper surface and the second lower surface.

5. The light emitting diode module of claim 1, further comprising a second plating layer disposed on the first plating layer, and a material of the second plating layer is palladium.

6. The light emitting diode module of claim 5, further comprising a third plating layer disposed on the second plating layer, and a material of the third plating layer is gold.

7. The light emitting diode module of claim 6, wherein an overall thickness of the first plating layer, the second plating layer and the third plating layer is larger than 1.5 microns.

8. A method of manufacturing a light emitting diode module, comprising:

covering a first protecting layer on a first metal layer to form a first conductive device, and covering a second protecting layer on a second metal layer to form a second conductive device;

covering around the first conductive device and around the second conductive device by an insulating structure, wherein the insulating structure comprises a first opening and a second opening; and disposing a first plating layer on the first protecting layer and the second protecting layer in the first opening and the second opening, such that at least a portion of the first plating layer fills up a first gap formed between the first protecting layer and the insulating structure and a second gap formed between the second protecting layer and the insulating structure, wherein the first plating layer is of a same material as the first protecting layer and the second protecting layer.

9. The method of claim 8, wherein a material of the first protecting layer, a material of the second protecting layer and a material of the first plating layer are nickel.

10. The method of claim 8, further comprising:

treating superficially the insulating structure and the first protecting layer and the second protecting layer in the first opening and the second opening before disposing the first plating layer.

11. The method of claim 8, wherein covering around the first conductive device and around the second conductive device by the insulating structure comprises:

covering completely a first lateral surface connected between a first upper surface and a first lower surface of the first conductive device and a second lateral surface connected between a second upper surface and a second lower surface of the second conductive device, the first lower surface is opposite to the first upper surface, the second lower surface is opposite to the second upper surface.

12. The method of claim 8, wherein a material of the first metal layer and a material of the second metal layer are copper.

13. The method of claim 8, further comprising:

disposing a second plating layer on the first plating layer.

14. The method of claim 13, wherein a material of the second plating layer is silver.

15. The method of claim 13, further comprising:

disposing a third plating layer on the second plating layer, such that an overall thickness of the first plating layer, the second plating layer and the third plating layer is larger than 1.5 microns.

16. The method of claim 15, wherein a material of the second plating layer is palladium, a material of the third plating layer is gold.

* * * * *